(12) United States Patent
Tsai

(10) Patent No.: US 7,265,975 B2
(45) Date of Patent: Sep. 4, 2007

(54) CPU HEAT DISSIPATING DEVICE STRUCTURE

(75) Inventor: Ming-Kun Tsai, Yunglin Hsien (TW)

(73) Assignee: Hua-Hsin Tsai, Hsinchu County (TW)

( * ) Notice: Subject to any disclaimer, the term of this patent is extended or adjusted under 35 U.S.C. 154(b) by 0 days.

(21) Appl. No.: 11/262,719

(22) Filed: Nov. 1, 2005

(65) Prior Publication Data

US 2007/0097638 A1    May 3, 2007

(51) Int. Cl.
*H05K 7/20* (2006.01)
*F28F 7/00* (2006.01)

(52) U.S. Cl. .............. 361/698; 361/696; 361/697; 174/15.2; 165/80.3; 165/80.4

(58) Field of Classification Search ............. 361/696, 361/699, 698; 174/15.1, 252, 15.2; 165/80.4
See application file for complete search history.

(56) References Cited

U.S. PATENT DOCUMENTS

| 5,168,919 | A | * | 12/1992 | Berenholz et al. | 165/80.4 |
| 5,323,847 | A | * | 6/1994 | Koizumi et al. | 165/104.33 |
| 5,485,671 | A | * | 1/1996 | Larson et al. | 29/890.032 |
| 5,940,270 | A | * | 8/1999 | Puckett | 361/699 |
| 6,529,376 | B2 | * | 3/2003 | Hamman | 361/698 |
| 6,549,408 | B2 | * | 4/2003 | Berchowitz | 361/700 |
| 6,591,898 | B1 | * | 7/2003 | Chu et al. | 165/80.4 |
| 6,999,316 | B2 | * | 2/2006 | Hamman | 361/701 |
| 2005/0052848 | A1 | * | 3/2005 | Hamman | 361/701 |
| 2005/0083656 | A1 | * | 4/2005 | Hamman | 361/699 |
| 2005/0083657 | A1 | * | 4/2005 | Hamman | 361/699 |
| 2006/0130506 | A1 | * | 6/2006 | Tain et al. | 62/259.2 |

* cited by examiner

*Primary Examiner*—Lisa Lea-Edmonds
*Assistant Examiner*—Anthony M Haughton
(74) *Attorney, Agent, or Firm*—Rosenberg, Klein & Lee

(57) ABSTRACT

A heat dissipating device includes a heat dissipating block, a liquid contained in the heat dissipating block, a first conduit joined to one end of the heat dissipating block, a second conduit joined to the other end of the heat dissipating block, a guiding tube, heat dissipating fins on the guiding tube, and a fan right above the heat dissipating fins; both the conduits communicate with the inside of the heat dissipating block; the guiding tube is connected to and communicates with the first and the second conduits at two ends so as to slope; the heat dissipating device is secured in position with the heat dissipating block closely touching an upper side of a CPU; therefore, the heat dissipating device will dissipate heat produced by the CPU with the fan producing wind to carry away heat carried to the heat dissipating fins and the liquid repeating a vaporization-condensation cycle.

6 Claims, 4 Drawing Sheets

CPU HEAT DISSIPATING DEVICE STRUCTURE

BACKGROUND OF THE INVENTION

1. Field of the Invention

The present invention relates to a CPU heat dissipating device, more particularly one, which can rapidly and effectively dissipate heat produced by a CPU with the fan producing wind to carry away heat carried to heat dissipating fins thereof and with a liquid contained therein repeating a vaporization-condensation cycle.

2. Brief Description of the Prior Art

CPU (central processing unit) is one of the major parts of a computer, and it will produce large amount of heat when the computer is used. During the operation, heat must be quickly carried away from the CPU otherwise the temperature of the CPU will become very high, and cause calculation speed reduction and breakdown of the CPU. If heat isn't carried away for a long period of time, and makes the temperature get too high, the CPU can even be burnt. In order for computer CPUs to function properly at normal working temperatures, CPUs usually have a heat dissipating device secured on an upper side thereof for dissipating heat produced by them.

Referring to FIG. 4, a currently existing heat dissipating device 8 includes a flat part 81, and several heat dissipating fins 82 spaced apart on the flat part 81. The heat dissipating device 8 is secured in position with the flat part 81 thereof closely touching an upper side of a CPU 10, and a fan 9 is positioned right above the heat dissipating device 8 for producing cool wind, which will carry away the heat traveling to the fins 82 from the CPU 10.

However, because the heat dissipating device only has the fins 82 and cool wind from the fan 9 for carrying heat away, heat still can't be rapidly and effectively dissipated, and temperature of the CPU will get high to such a degree as to cause reduction in the CPU calculation speed after the computer has been used for a certain length of time.

SUMMARY OF THE INVENTION

It is a main object of the invention to provide an improvement on a CPU heat dissipating device to overcome the above problem.

The heat dissipating device of the present invention includes a heat dissipating block, a liquid contained in the heat dissipating block, a first conduit joined to one end of the heat dissipating block, a second conduit joined to the other end of the heat dissipating block, a guiding tube, heat dissipating fins secured on the guiding tube, and a fan right above the heat dissipating fins. Both the conduits communicate with the inside of the heat dissipating block while the guiding tube is connected to and communicates with the first and the second conduits at two ends thereof in such a way as to slope. The heat dissipating device is secured in position with the heat dissipating block closely touching an upper side of a CPU. Therefore, the heat dissipating device will dissipate heat produced by the CPU rapidly and effectively with the fan producing cool wind to carry away heat carried to the heat dissipating fins by the liquid and the liquid repeating a vaporization-condensation cycle.

BRIEF DESCRIPTION OF THE DRAWINGS

The present invention will be better understood by referring to the accompanying drawings, wherein.

DETAILED DESCRIPTION OF THE PREFERRED EMBODIMENTS

Figure 1:
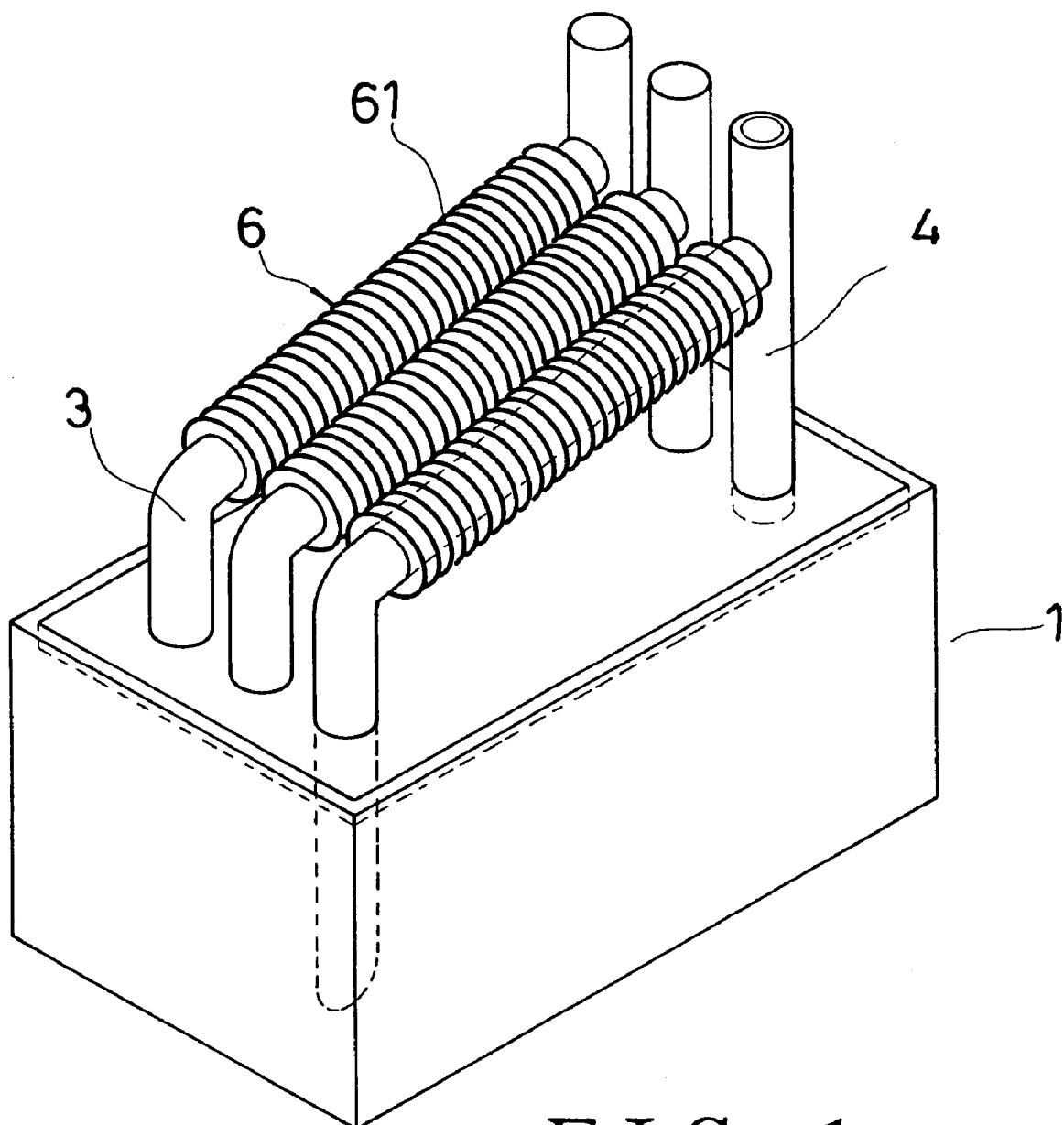
FIG. 1 is a perspective view of the heat dissipating device for CPU in the present invention.
Figure 2:
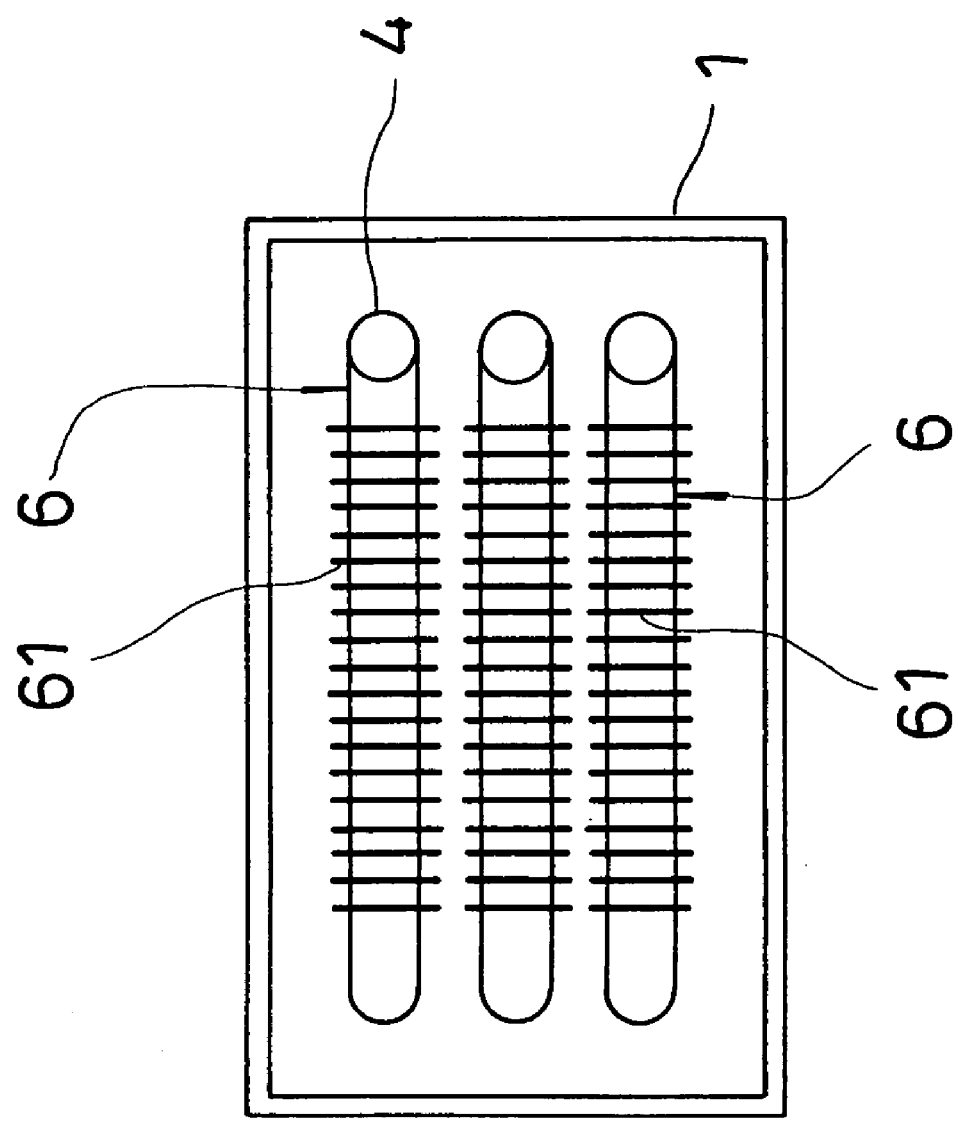
FIG. 2 is a top view of the heat dissipating device in the invention.
Figure 3:
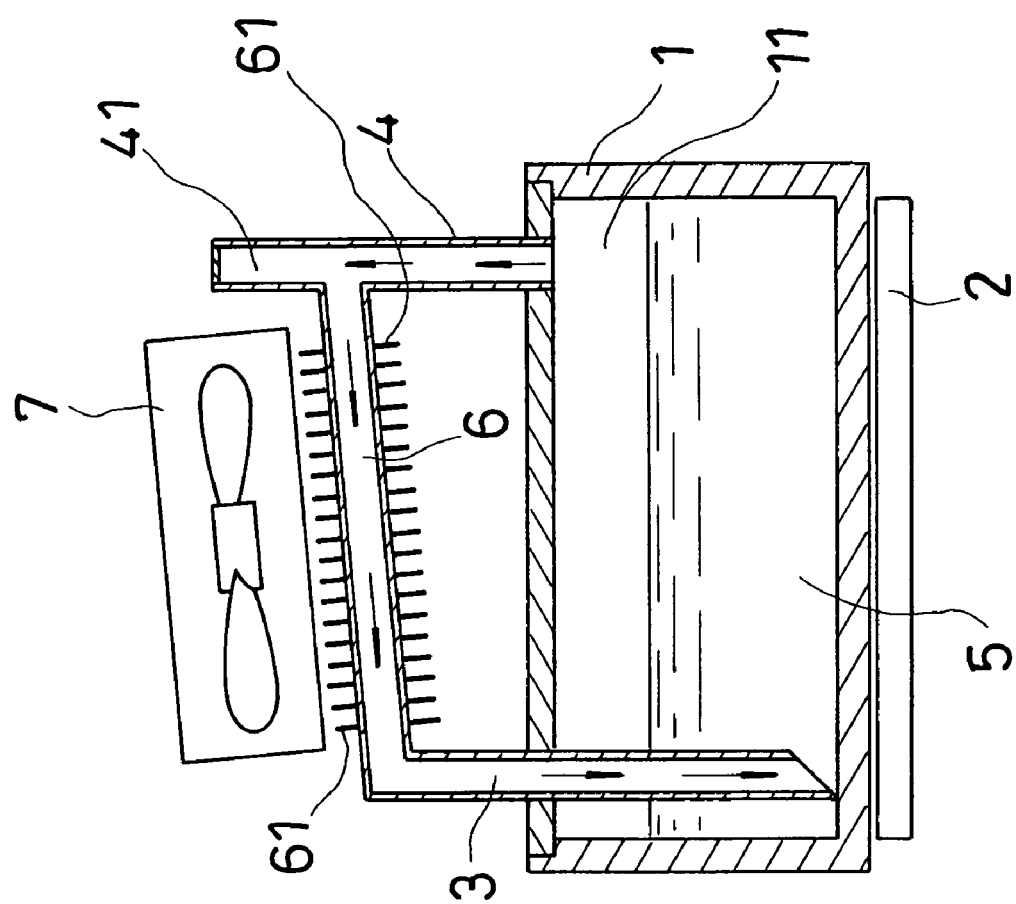
FIG. 3 is a view showing the way of dissipating heat by the heat dissipating device in the present invention.
Figure 4:
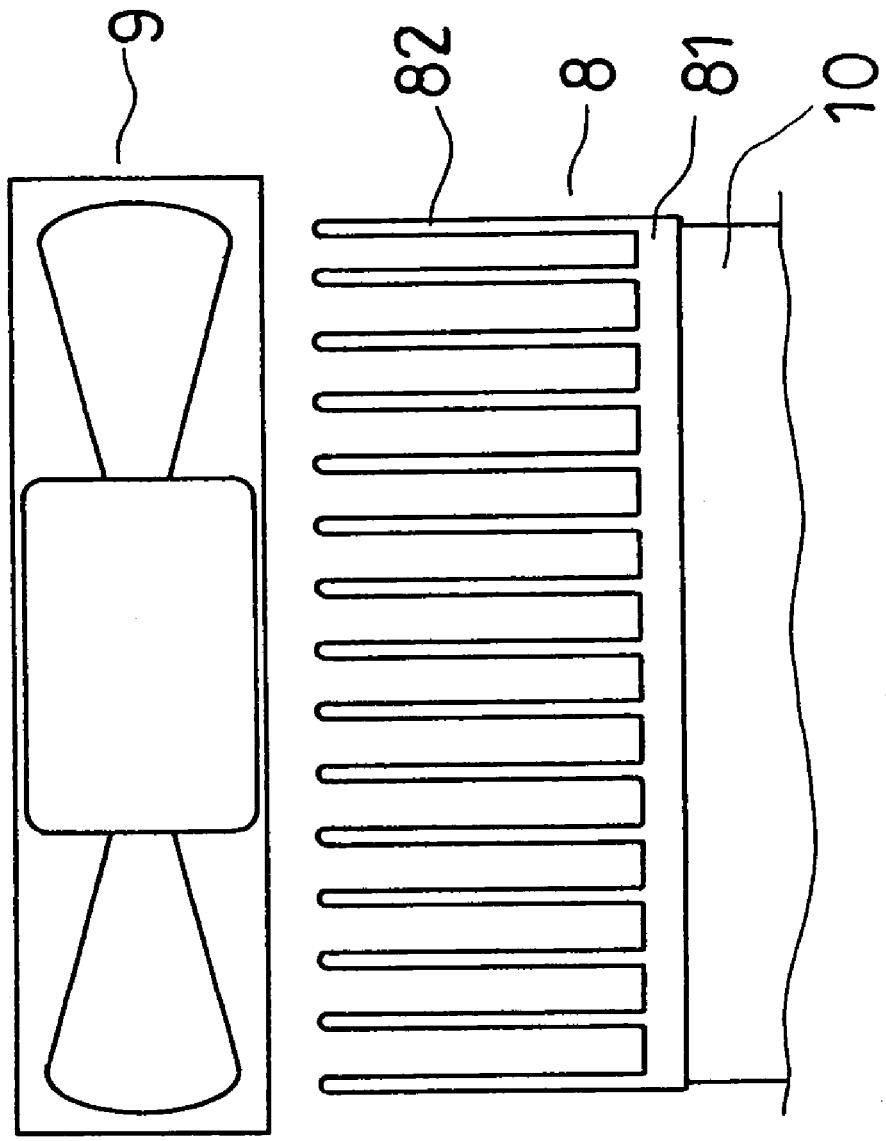
FIG. 4 is side view of the currently existing heat dissipating device.

Referring to FIGS. 1 to 3, a preferred embodiment of a CPU heat dissipating device in the present invention includes a heat dissipating block 1, several heat dissipating conduits 3 and 4, a liquid 5, guiding tubes 6, and a fan 7.

The heat dissipating block 1 has a holding room 11 therein. The heat dissipating conduits 3 are joined to one end of the heat dissipating block 1, and communicate with the holding room 11 with lower ends thereof being within a lowermost portion of the holding room 11. The heat dissipating conduits 4 are joined to the other end of the heat dissipating block 1, and communicate with the holding room 11. One of the heat dissipating conduits 4 has an inlet 41 at an upper end thereof. The guiding tubes 6 are connected to and communicate with respective ones of the heat dissipating conduits 3 at first ends thereof, and they are connected to and communicate with respective ones of the heat dissipating conduits 4 at second ends thereof such that they slope down towards the first ends thereof. In other words, the second ends of the guiding tubes 6 are of a greater height than the first ends.

The heat dissipating fins 61 are spaced apart on outer sides of the guiding tubes 6. The liquid 5 can be a cooling medium, and it is contained in the holding room 11 of the heat dissipating block 1; the liquid 5 is injected into the holding room 11 through the inlet 41, and the inlet 41 is sealed after injection of the liquid 5. The fan 7 is positioned right above the heat dissipating fins 61.

Referring to FIG. 3, to use the heat dissipating device, the device is secured in position with the heat dissipating block 1 closely touching an upper side of a CPU (central processing unit) 2. Therefore, when the CPU 2 runs and produces heat, the heat will be absorbed by means of the liquid 5, and in turn the liquid 5 will be evaporated. Next, the vaporized form of the liquid 5 will travel into the heat dissipating conduits 4, and travel into the guiding tubes 6, and the heat carried by the vaporized form of the liquid 5 is absorbed by means of the heat dissipating fins 61 on the guiding tubes 6, and quickly dissipated by cool wind caused by the fan 7, and in turn the vapor condenses, changing back into the liquid form; thus, the liquid 5 will flow through the guiding tubes 6 and the heat dissipating conduits 3 and back into the holding room 11. Therefore, the heat dissipating device will dissipate heat produced by the CPU 2 rapidly and effectively with the fan 7 producing cool wind and the liquid 5 repeating the vaporization-condensation cycle.

From the above description, it can be easily seen that the heat dissipating device of the present invention can rapidly and effectively dissipate large amount of heat produced by a CPU, thus preventing high temperature from being produced to cause reduction in the processing and calculation speed and the stability of the CPU.

What is claimed is:

1. An improvement on a CPU heat dissipating device structure, comprising:
   a heat dissipating block contiguous an upper side of a CPU; the heat dissipating block having a holding room defined therein;
   a plurality of a first type of heat dissipating conduits joined to one end of the heat dissipating block, and communicating with the holding room of the heat dissipating block;
   a plurality of a second type of heat dissipating conduits joined to one end of the heat dissipating block, and communicating with the holding room;
   a plurality of guiding tubes having opposing first and second ends, the guiding tubes being connected to and communicating with the first type and the second type of heat dissipating conduits at two ends thereof wherein each of said guiding tubes is inclined downwardly from a first end in fluid communication with a respective one of said heat dissipating conduits and a second end in fluid communication with a respective end of one of said second heat dissipating conduits to allow flow of condensed liquid into said heat dissipation block by gravity assist;
   a liquid contained in the holding room of the heat dissipating block;
   a plurality of annular heat dissipating fins having a greater diameter than the outer diameter of the guiding tube being arranged on the guiding tube; and
   a fan positioned adjacent the heat dissipating fins.

2. The improvement on a CPU heat dissipating device structure as claimed in claim 1, wherein the liquid is a cooling medium.

3. The improvement on a CPU heat dissipating device structure as claimed in claim 1, wherein one of the heat dissipating conduits is passed into the heat dissipating block with a lower end thereof being within a lowermost portion of the holding room.

4. The improvement on a CPU heat dissipating device structure as claimed in claim 3, wherein the liquid is a cooling medium.

5. The improvement on a CPU heat dissipating device structure as claimed in claim 1, wherein one of the heat dissipating conduits has an inlet at an upper end; the liquid being injected into the holding room of the heat dissipating block through the inlet; the inlet being sealed after injection of the liquid.

6. The improvement on a CPU heat dissipating device structure as claimed in claim 5, wherein the liquid is a cooling medium.

* * * * *